United States Patent [19]
Finnigan

[11] Patent Number: 5,768,089
[45] Date of Patent: Jun. 16, 1998

[54] VARIABLE EXTERNAL CAPACITOR FOR NMR PROBE

[75] Inventor: James Patrick Finnigan, Santa Clara, Calif.

[73] Assignee: Varian Associates, Inc., Palo Alto, Calif.

[21] Appl. No.: 781,422

[22] Filed: Jan. 10, 1997

[51] Int. Cl.$^6$ .................................................. H01G 5/00
[52] U.S. Cl. ...................... 361/287; 361/277; 361/296
[58] Field of Search ............................ 361/277, 283.2, 361/287, 292, 298.1, 299.1, 299.2, 283.3, 299.4, 296; 324/322, 318, 238, 662, 678, 725, 207.24, 207.16; 333/227, 245, 248, 219–235

[56] References Cited

U.S. PATENT DOCUMENTS

| | | | |
|---|---|---|---|
| 4,490,772 | 12/1984 | Blickstein | 361/281 |
| 5,206,785 | 4/1993 | Hukashima | 361/283 |
| 5,229,911 | 7/1993 | Ditlya | 361/277 |
| 5,530,353 | 6/1996 | Blanz | 324/315 |
| 5,557,495 | 9/1996 | Belcher et al. | 361/298.2 |

*Primary Examiner*—Kristine L. Kincaid
*Assistant Examiner*—Anthony Dinkins

[57] ABSTRACT

A variable external capacitor produces greater functionality for NMR probes by reducing the size of components and efficiently arranging the components. The variable external capacity has a cavity that allows adjustment tools to be extended through the variable external capacitor to adjust additional components that may be stacked above the variable external capacitor. The cavity may be used to house reactance such as a fixed capacitor or inductor connected in parallel with the variable external capacitor. The variable external capacitor includes a polytetrafluoroethylene housing configured to minimize its size and reduce lead lengths of the NMR circuit. A silver deposit plate on the polytetrafluoroethylene housing constitutes a stationary capacitor plate. A drum disposed inside the cavity and movably spaced from the stationary capacitor plate functions as a movable capacitor plate. An anti-rotation rail supports the drum to prevent rotation. The drum includes internal threads that cooperates with threads provided in a plunger for adjustment of the drum in a translational direction. The plunger is supported by the rail and extends outside the cavity of the polytetrafluoroethylene housing for rotational adjustment. An insulator spaces the plunger and the drum from the stationary capacitor plate. The insulator and plunger provide a through passageway for an adjustment tool to extend therethrough. Alternatively, the space inside the insulator and plunger may be used to house a capacitor or inductor electrically supported by a current-conducting stick and connected in parallel with the variable external capacitor. A capacitor stick shifts the capacitance of the variable external capacitor, while an inductor stick forms a parallel LC resonant circuit. The structure provides the flexibility of choosing a stick to form a desirable circuit element for increased functionality of the NMR probe.

30 Claims, 7 Drawing Sheets

VARIABLE EXTERNAL CAPACITOR FOR NMR PROBE

FIELD OF THE INVENTION

This invention relates generally to a capacitor in the circuit of a nuclear magnetic resonance (NMR) probe, and more particularly to a variable capacitor having a passageway through which an adjustment tool may extend for adjusting components stacked longitudinally in the NMR probe, and through which other components may be inserted to increase the functionality of the NMR probe without compromising the performance of the NMR circuit.

BACKGROUND OF THE INVENTION

An NMR probe holds a sample placed in a uniform polarizing magnetic field in NMR spectrometry. A coil is disposed close to the sample within the probe to apply an exciting RF magnetic field to the sample. The resultant resonance signal of the sample is picked up by the coil and delivered to a receiver circuit. The receiver circuit generates an output signal. A computer takes the Fourier transform of the signal to obtain an NMR spectrum.

The NMR apparatus is most often characterized in gross by cylindrical symmetry. The internal structure of the probe generally exhibits no geometric symmetry because it contains circuits, circuit elements, connectors, fluid supply tubes, mechanical mounting means for all of the above and the like. A typical NMR magnet is of the superconducting variety and is housed in a dewar which includes a room temperature cylindrical bore in which a very carefully controlled homogeneous magnetic field is sustained by operation of the superconducting magnet in the interior of the dewar. The NMR probe contains the excitation and detection interface to the sample and is mounted in a cylindrical housing for insertion in the bore.

The design of NMR probes for greater functionality and applicability has produced probes that can be tuned to a wider range of frequencies. Probes have limited diameters, which limit the number of components that can fit into the probe. Although components may be stacked in the longitudinal direction of the probe, the need to adjust certain components using adjustment tools such as external rods and sticks limits the type of components that may be stacked, since such adjustment tools extend longitudinally through the probe. The limited number of functional features that can be added to the probe with limited space in the interior cross-section places constraints on probe functionality. Although it is possible to decrease the spacing between the components within the probe, the close spacing may produce problems such as stray capacitance that generate low Q (quality factor) for the probe circuits and adversely affect the performance of the probe.

SUMMARY OF THE INVENTION

There is therefore a need to design an NMR probe with better utility of the limited space without compromising its performance.

It is a feature of this invention to provide a variable capacitor having a passageway through which an adjustment tool may extend to adjust a component stacked above the variable capacitor.

It is another feature of this invention to position other components within the cavity of the variable capacitor to increase the number of functional features that can be added to the NMR probe.

It is another feature of the present invention to reduce lead length, minimize the size of the variable capacitor, and increase the performance of the NMR circuit.

In accordance with one aspect of the present invention, a variable external capacitor in a nuclear magnetic resonance probe comprises a housing which includes an external capacitor member and a current-conducting ring insulated from the external capacitor member. The housing defines a capacitor cavity. An internal capacitor member is disposed at least partially inside the capacitor cavity and spaced from the external capacitor member by a distance. The internal capacitor member is movable within the capacitor cavity to vary the distance, and is insulated from the external capacitor member. A current-conducting rail is connected between the ring and the internal capacitor member. The variable external capacitor further comprises a current-conducting plunger connected to the internal capacitor member and the rail. The plunger is adjustable to move the internal capacitor member in the capacitor cavity.

In accordance with another aspect of the invention, a variable external capacitor comprises a variable capacitor having a stationary capacitor component, a movable capacitor component movable relative to the stationary capacitor component, and a dielectric disposed between the stationary capacitor component and the movable capacitor component. The dielectric and the stationary capacitor member define an internal cavity. A reactance is disposed at least partially within the internal cavity and connected between the stationary capacitor component and the movable capacity component. A retractable rod is connected to the reactance and the movable capacitor component. The rod is adjustable to move the movable capacitor component relative to the stationary capacitor component and to retrieve the reactance.

Another aspect of this invention is an adjustable external capacitor which comprises a variable capacitor having a cavity and a reactance releasably disposed within the cavity and electrically connected across the variable capacitor. The adjustable external capacitor further comprises a means for adjusting the capacitance of the variable capacitor.

BRIEF DESCRIPTION OF THE DRAWINGS

The preferred embodiments of this invention, illustrating all their features, will now be discussed in detail. These embodiments depict the novel and nonobvious external variable external capacitor of this invention shown in the accompanying drawings, which are included for illustrative purposes only. These drawings include the following figures, with like numerals indicating like parts.

DETAILED DESCRIPTION OF THE PREFERRED EMBODIMENTS

In accordance with this invention, the variable external capacitor 10 provides a passageway or cavity 12 in a variable capacitor to allow components inside the NMR probe to be integrated or stacked. Although it is not difficult to produce a capacitor with a passageway or cavity 12, traditional methods of doing so produce such a large capacitor that the size occupied by the capacitor largely negates the space it is intended to save. The variable external capacitor 10 of this invention is configured to be compact and efficient to allow space-saving integration and stacking of the components in the NMR probe. The cavity 12 allows the insertion of adjustment tools and facilitates stacking of components. The cavity 12 may also be configured to house a reactance such as a fixed capacitor or inductor that may be fixed, as discussed below.

Figure 1:
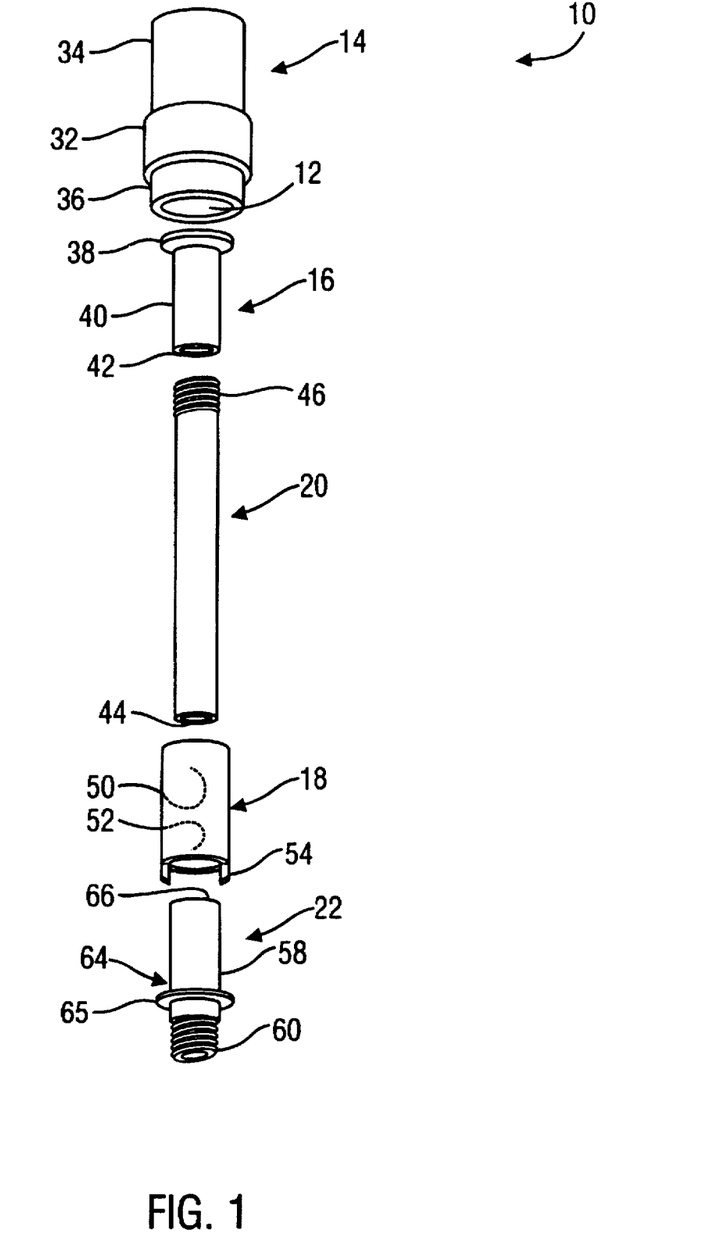
FIG. 1 is an exploded perspective view illustrating the variable external capacitor of this invention.
Figure 2:
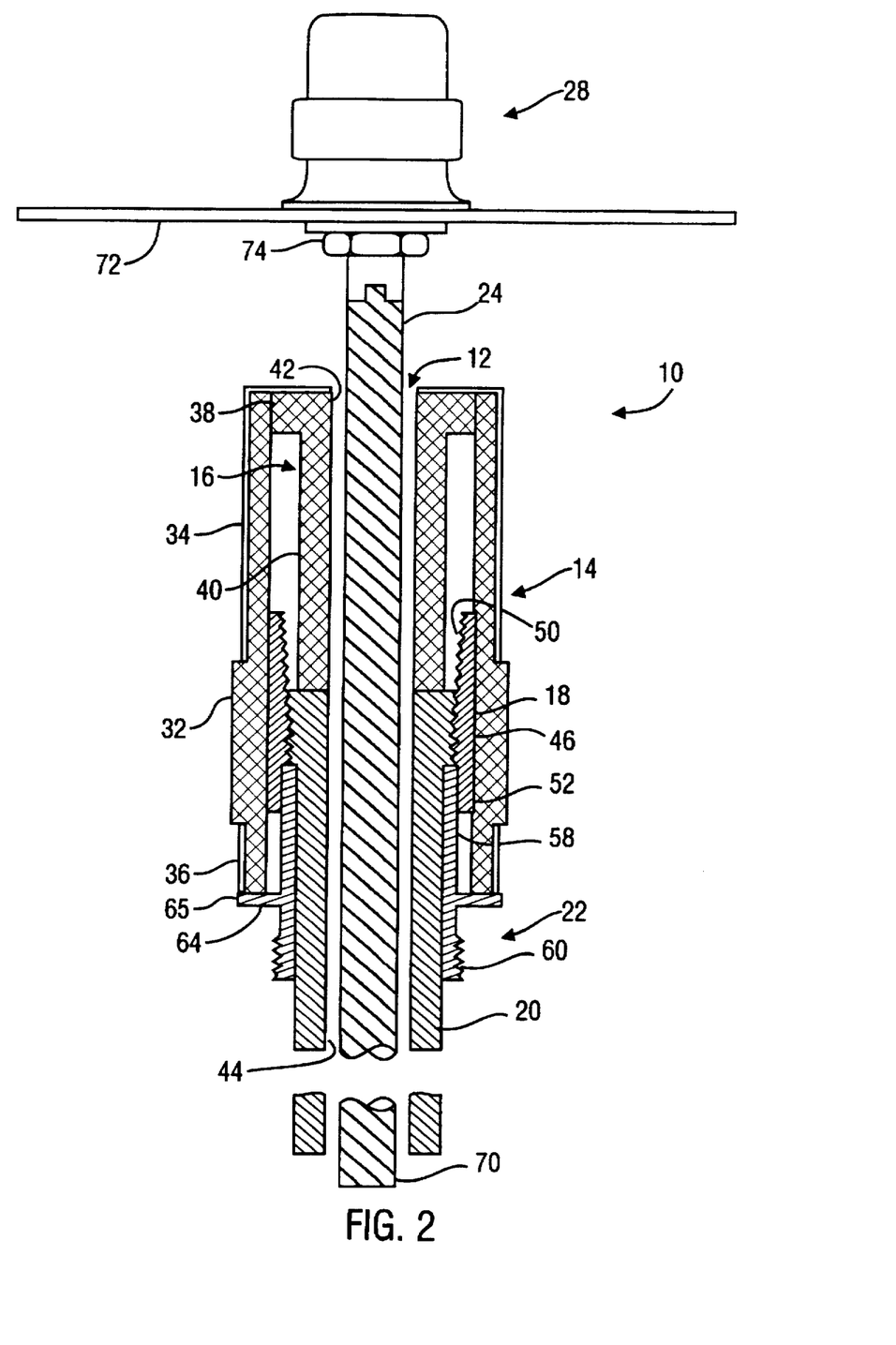
FIG. 2 is a cross-sectional view of the variable external capacitor illustrating the adjustment of a stacked component.

A. Variable External Capacitor FIGS. 1 and 2 show the variable external capacitor 10 which comprises a housing 14, an insulator or dielectric 16 and a drum 18 disposed inside the passageway 12 provided through the interior of the housing 14. The insulator 16 and drum 18 are connected to a plunger 20 which extends partially into the passageway 12 of the housing 14. A rail 22 is connected to the lower end of the housing 14 to support the plunger 20, drum 18, and insulator 16 in the passageway 12. An adjustment stick 24 extends from the lower end through an inner passageway provided by the plunger 20 and insulator 16 to engage an upper variable component 28 stacked above the variable external capacitor 10 for adjustment.

Referring to FIG. 1, the housing 14 is desirably made of a generally hollow cylindrical dielectric 32 with an upper member 34 and a lower ring 36 separated by the dielectric 32. The upper member 34 is desirably a silver deposit member and the ring 36 is desirably a silver deposit ring 36 onto the dielectric 32. The silver deposited housing 14 may utilize a "Silver Conductive Paint" with cellulose ester and methacrylate type resins as binders and is available from capacitor manufacturers such as Voltronics Capacitor Mfg. The process of plating to make such a component is known in the art. See, e.g., "METAL FINISHING" GUIDE BOOK AND DIRECTORY, Volume 93, No. 1A (January 1995). Other capacitors having a similar structure may also be used.

The insulator or dielectric 16 is a generally circular, hollow member having a cap 38 that is larger in cross-section than the cylindrical portion 40. The insulator 16 has an insulator bore 42 that is desirably circular cylindrical. The cross-section of the cap 38 desirably fills substantially the cross-section provided in the passageway 12 of the housing 14 defined by the insulating wall 32. The insulator 16 is made of an electrically insulating material, such as quartz or glass, and is desirably made of Teflon. In one embodiment, the insulator 16 is about 0.18" in diameter and 0.72" long with the cap 38 having a diameter of about 0.265" and the bore 42 of about 0.232".

The plunger 20 is generally circular cylindrical with a plunger bore 44. The plunger bore 44 is desirably circular cylindrical with a bore size approximately the same as that of the insulator bore 42. The wall thickness of the plunger 20 is desirably about the same as the wall thickness of the cylindrical portion 40 of the insulator 16. The plunger 20 preferably includes an outer threaded portion 46 at the upper end. The lower end of the plunger 20 desirably extends outside the NMR probe (not shown). The plunger 20 is made of a current-conducting material such as phosphor/bronze or copper. The plunger 20 shown has a diameter of about 0.21" and a $^{10}/_{64}$ thread of about 0.1" long for the threaded portion 46 and a plunger bore 44 of about 0.19".

Referring to FIG. 1, the drum 18 is a hollow member that is desirably circular cylindrical having a drum interior that is larger in cross-section than the plunger 20. The drum interior preferably includes a threaded upper portion 50 and a smooth lower portion 52 formed, for example, by polishing. The threaded upper portion 50 is sized to cooperate with the outer threaded portion 46 of the plunger 20 and defines a thicker wall portion than the smooth lower portion 52. The threaded upper portion 50 is advantageously longer in the longitudinal direction than the outer threaded portion 46 of the plunger 20. At least one and desirably a pair of tabs or stubs or guides 54 disposed opposite from one another extend downwardly from the lower end of the drum 18. The drum 18 is made of a current-conducting material, such as phosphor/bronze or copper. In one embodiment, the drum 18 has an outer diameter of about 0.265" and an inner diameter of about 0.235", and a length of about 1".

The rail 22 is a hollow member that desirably comprises a cylindrical upper portion 58 and an external threaded lower portion 60 which together define a rail cavity that is desirably cylindrical with a cross-section about the same as or larger than the cross-section defined by the outer wall of the plunger 20. The outer wall of the cylindrical upper portion 58 of the rail 22 is desirably smooth (e.g., by polishing) and about the same in cross-section as the cross-section of the smooth lower portion 52 of the drum interior. The rail 22 advantageously comprises a flange 64 that is disposed between the upper portion 58 and the lower portion 60 and has an outer edge 65 that extends to or beyond the ring 36 on the housing 14. The upper portion 58 desirably includes at least one and desirably a pair of grooves or slots 66 that are sized to engage the tabs 54 of the drum 18 to prevent relative rotational movement between the drum 18 and the rail 22. The rail 22 is made of a current-conducting material such as phosphor/bronze or copper. The rail 22 of FIG. 1 is about 1.15" in length, 0.232" in outer diameter, and 0.212" in inner diameter.

The adjustment stick 24 is generally a long and slender stick or shaft that is desirably insulated. The adjustment stick 24 has a size smaller than the inner passageway provided by the insulator 16 and the plunger 20 to avoid interference by those components while maneuvering the adjustment stick 24. The lower end 70 of the adjustment stick 24 desirably extends outside the NMR probe and outside the plunger 20 to be reachable by hand.

Referring to the assembled variable external capacitor 10 of FIG. 2, the insulator 16 is disposed inside the passageway 12 of the housing 14 with its cap 38 adjacent the upper member 34 of the housing 14. The insulator 16 serves as a spacer to separate the plunger 20 from the upper member 34. The plunger 20 is disposed partially within the passageway 12 with its outer threaded portion 46 adjacent the insulator 16, and is accessible from outside of the passageway 12 of the housing 14. The insulator 16 advantageously keeps the plunger 20 in position to avoid an unwanted change in capacitance. As discussed below, the only desirable change in capacitance should be effected by the movement of the drum 18.

The threaded upper portion 50 at the interior of the drum 18 is threaded onto the outer threaded portion 46 of the plunger 20, such that the drum 18 is disposed inside the dielectric wall 16 of the passageway 12 of the housing 14. The smooth lower portion 52 of the drum interior is preferably spaced from the plunger 20. The drum 18 is also spaced from the silver deposit upper member 34 by the insulator 16. The drum 18 is advantageously movable in the longitudinal direction with respect to the dielectric wall 16 of the housing 14, which may result from a smooth slidable contact between the drum 18 and the insulator wall 16 or by a clearance therebetween.

To support the drum 18, insulator 16, and outer threaded portion 46 of the plunger 20 within the passageway 12 of the housing 14, the rail flange 64 is connected to the lower end of the housing 14, such as by soldering the flange 64 onto the silver deposit ring 36. The upper portion 58 of the rail 22 is advantageously disposed between the drum 18 and the plunger 20 with the smooth upper portion 58 of the rail 22 contacting the smooth lower portion 52 at the drum interior. The polished mating contact not only permits smooth sliding motion between the drum 18 and the rail 22, but facilitates current flow therebetween. The rail 22 and the plunger 20 are desirably mated with smooth contact or with a clearance to allow rotation of the plunger 20 with respect to the rail 22. The grooves 66 of the rail 22 advantageously engage the tabs 54 of the drum 18 to prevent relative rotation between the drum 18 and the rail 22. Because the rail 22 is attached to the housing 14, the rail 22 serves as an anti-rotation component to prevent rotation of the drum 18. The external threaded portion 60 of the rail 22 allows the rail 22 to be mounted onto a structural component or support such as the mounting of the upper variable component 28 onto a copper plated G-10 or solid copper PC board 72 using a mounting nut 74 that cooperates with an external threaded portion, as best seen in FIG. 2.

As assembled, the only component of variable external capacitor 10 that moves in the longitudinal direction is the drum 18. The adjustment is made with the turning of the plunger 20 at its exposed end. The longitudinal position of the plunger 20 is fixed by the insulator 16 and the rail 22. When the plunger 20 is rotated, the outer threaded portion 46 of the plunger 20 drives the drum 18 up and down in the longitudinal direction because the drum 18 is locked in the rotational direction by the rail 22 attached to the housing 14. A rotating drum 18 without the anti-rotation rail 22 would cause small nonlinear changes in capacitance, which may be undesirable. The anti-rotation rail 22 keeps the drum 18 and plunger 20 in fixed longitudinal positions to permit precise adjustment of the capacitance of the variable external capacitor 10 using the plunger 20. The anti-rotation mechanism also avoids jumps in capacitance which may otherwise be caused by the irregularity of surface contact between the drum 18 and the rail 22 during rotation.

As shown in FIG. 2, the silver deposit upper member 34 serves as a first capacitor plate or component while the drum 18 serves as a second capacitor plate or component of the variable external capacitor 10. The first capacitor plate 34 is stationary and the second capacitor plate 18 is movable to adjust the capacitance. The stationary capacitor plate 34 is electrically connected to the NMR circuit (not shown). The polytetrafluoroethylene section in the middle 32 which is not plated acts to separate the two plated sections 34, 18 that are at different potentials. For the movable capacitor plate 18, current is conducted from the drum 18 to the rail 22 onto the ring 36 and the NMR circuit. The smooth mating between the polished surfaces of the drum 18 and the rail 22 results in a good RF contact, and improves conductivity and creates a high Q path for the current to flow between the rail 22 and the drum 18.

The adjustment stick 24 has a lower end 70 outside the NMR probe for adjustment by hand. The upper end of the adjustment stick 24 is shown in FIG. 2 to connect to an upper variable component 28 such as another variable capacitor stacked above the variable external capacitor 10. The adjustment stick 24 is desirably rotatable to adjust the capacitance of the stacked capacitor or other adjustable components 28. The stacking arrangement provides more room in the cross-section of the NMR probe for additional functionality.

Figure 3:
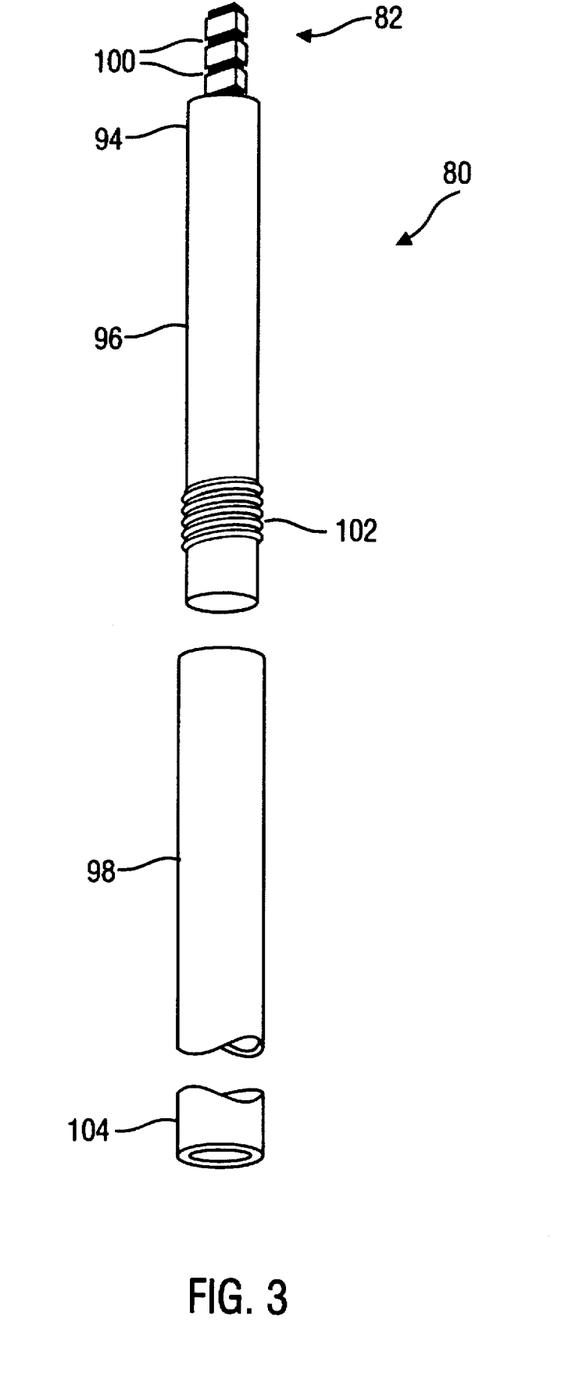
FIG. 3 is a perspective view of a capacitor stick.
Figure 4:
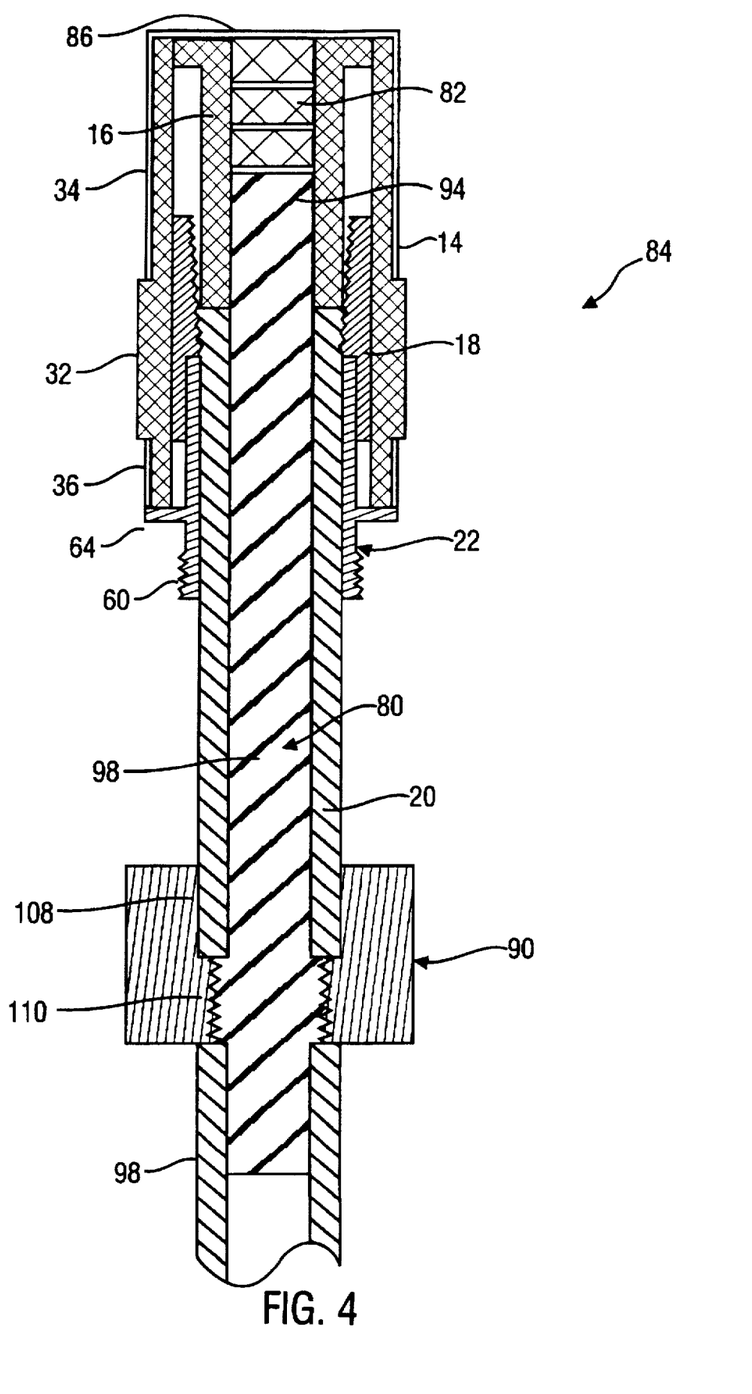
FIG. 4 is a cross-sectional view of the capacitance shifted variable external capacitor.

B. Capacitance Shifted Variable External Capacitor FIG. 3 shows a capacitor stick 80 that can be used to connect a fixed capacitor 82 with the variable external capacitor 10. FIG. 4 illustrates the variable external capacitor 10 electrically connected to a fixed capacitor 82 provided in the cavity 12 of the housing 14 by a retractable capacitor stick 80 for shifting the capacitance range of the variable external capacitor 10.

The capacitance shifted (CS) variable external capacitor 84 comprises the variable external capacitor 10 of FIGS. 1 and 2 with the first capacitor plate or member 34 formed by the silver deposit enclosed to form an upper end 86 that may be open but is desirably closed. A capacitor stick 80 extends through an inner space provided by the plunger 20 and insulator 16 to connect with the first capacitor member 34 at the closed end 86 of the variable external capacitor 10. A threaded adapter 90 is desirably provided to connect the capacitor stick 80 to the plunger 20.

Referring to FIG. 3, the capacitor stick 80 is a long member with at least one fixed capacitor 82, desirably a plurality of fixed chip capacitors 82 stacked in series, disposed at the fixed capacitor mount 94 of its upper tip. The capacitor stick 80 desirably comprises a current-conducting upper portion 96 and a nonconducting lower portion 98. The upper portion 96 is desirably cylindrical with a cross-section approximately equal to or smaller than the plunger bore 44 and the insulator bore 42. The upper portion 96 further comprises an external threaded portion 102 near the intersection with the nonconducting lower portion 98. The lower portion advantageously includes a lower tip 104 that is disposed outside the NMR probe (not shown). The upper portion 96 may be made of phosphor/bronze or copper or other current-conducting material while the lower portion may be made of plastic or other nonconducting material.

One method of forming the series of chip capacitors 82 is by soldering chip capacitors 82 held together in a holding fixture (not shown) in a desirable arrangement with a solder 100. The soldered chip capacitors 82 are then removed from the holding fixture. The fixed capacitor mount 94 at the upper portion 96 of the capacitor stick 80 is inserted into a mount fixture (not shown). The soldered chip capacitors 82 are soldered onto the fixed capacitor mount 94. After the solder has solidified, the capacitor stick 80 is turned upside down with the top chip capacitor pressed firmly against a pretinned silver foil, which is heated to produce solder flows (not shown). The capacitor stick 80 is removed from the silver foil to allow the solder to harden. The silver foil on the chip capacitors 82 are trimmed and the mount stem is sanded and dipped in acetone for cleaning.

The threaded adapter 90 is hollow with a generally circular cylindrical cross-section. The adapter bore has an upper portion 108 with a bore size approximately equal to the size of the plunger 20, and a lower threaded portion 1 10 that is sized to cooperate with the external threaded portion 102 of the capacitor stick 80. The threaded adapter 90 is made of a current-conducting material such as phosphor-bronze or copper.

Referring to the assembled CS variable external capacitor 84 of FIG. 4, the insulator 16 is disposed inside the cavity 12 of the CS variable external capacitor 84 with its cap 38 connected to the closed end 86 of the CS variable external capacitor 84 in contact with the silver deposit plate 34. The insulator 16 serves as a spacer to separate the plunger 20 from the silver deposit plate 34. The plunger 20 is disposed partially within the cavity 12 with its outer threaded portion 46 adjacent the insulator 16, and is accessible from outside of the cavity 12 of the CS variable external capacitor 84. The insulator 16 advantageously keeps the plunger 20 in position to avoid an unwanted change in capacitance. The structural arrangement and function of the housing 14, insulator 16, drum 18, plunger 20, and rail 22 are generally the same as those of FIGS. 1 and 2 discussed above.

The capacitor stick 80 is mechanically and electrically connected to the lower portion of the plunger 20 by the threaded adapter 90. The upper portion 108 of the adapter bore is desirably press fit onto the plunger 20 while the lower threaded portion 110 of the adapter is threaded onto the external threaded portion 102 of the capacitor stick 80. The plunger 20 thus need not extend outside the NMR probe for adjustment. The chip capacitors 82 at the fixed capacitor mount 94 of the capacitor are disposed inside the cavity 12 of the CS variable external capacitor 84 with the top chip capacitor 82 in contact with the silver deposit plate 34. The only current-conducting component in contact with bottom chip capacitor 82 is the upper mount portion 94 of the capacitor stick 80. The chip capacitors 82 do not make contact with any other current-conducting component.

As assembled, the only component of CS variable external capacitor 84 that moves in the longitudinal direction is the drum 18. The adjustment is made with the turning of the plunger 20 effected by the turning of the capacitor stick 80 with a portion press fit with the plunger 20. The longitudinal position of the plunger 20 is fixed by the insulator 16 and the rail 22. When the plunger 20 is rotated, the outer threaded portion 46 of the plunger 20 drives the drum 18 up and down in the longitudinal direction because the drum 18 is locked in the rotational direction by the rail 22 attached to the CS variable external capacitor 84. A rotating drum 18 without the anti-rotation rail 22 would cause small nonlinear changes in capacitance, which may be undesirable. The antirotation rail 22 keeps the drum 18 and plunger 20 in a fixed longitudinal position to permit precise adjustment of the capacitance of the CS variable external capacitor 84 using the capacitor stick 80. The anti-rotation mechanism also avoids jumps in capacitance which may otherwise be caused by the irregularity of surface contact between the drum 18 and the rail 22 during rotation.

As shown in FIG. 4, the silver deposit plate 34 serves as a first capacitor plate or component while the drum 18 serves as a second capacitor plate or component of the CS variable external capacitor 84. The first capacitor plate 34 is stationary and the second capacitor plate 18 is movable to adjust the capacitance. The stationary capacitor plate 34 is electrically connected to the NMR circuit. For the movable capacitor plate 18, current is conducted from the drum 18 to the rail 22 onto the ring 36 and NMR circuit (not shown).

The fixed capacitors 82 are desirably connected to the variable external capacitor 10 in parallel. The top chip capacitor 82 is connected to the silver deposit plate 34 and stacked on top of two other chip capacitors 82. The bottom chip capacitor 82 is connected to the current-conducting upper portion 96 of the capacitor stick 80, which is in turn connected to the drum 18 and rail 22 through the plunger 20. The insulator 16 advantageously isolates the fixed chip capacitors 82 from the drum 18 since they are at different potentials. The top chip capacitor 82 makes contact with the inside of the silver deposit plate 34 (stationary capacitor plate) of the variable external capacitor 10, which is at one potential. The upper portion 96 connected to the bottom chip capacitor 82 makes contact with the drum 18 (movable capacitor plate), which is at a different potential. The configuration of the fixed chip capacitors 82 in parallel with the variable external capacitor 10 causes a shift in the range of the variable capacitance to form the CS (capacitance shifted) variable external capacitor 84. In the embodiment shown in FIGS. 3 and 4, three chip capacitors 82 are stacked on top of each other. Advantageously, the chip capacitors 82 have the same voltage breakdown characteristics as the variable external capacitor 10. For instance, the variable external capacitor 10 has a breakdown voltage of 1500 volts. Three chip capacitors 82 of 500 volts arranged in series will handle 1500 volts, equal to the breakdown voltage of the variable external capacitor 10.

The capacitor stick 80 allows the shifting of the tuning range of the CS variable external capacitor 84 without affecting the Q (quality factor) of the NMR circuit or voltage handling characteristics of the CS variable external capacitor 84. Having the fixed chip capacitors 82 and the variable external capacitor 10 in close proximity with each other advantageously reduces the lead length between them. Indeed, the lead length between the two components is eliminated by integrating the fixed capacitors 82 and the variable external capacitor 10. The configuration with the internally threaded drum 18 is advantageously designed to be compact and to minimize the size of the integrated CS variable external capacitor 84. The compact, integrated configuration desirably allows the fixed chip capacitors 82 and variable external capacitor 10 to be close to the NMR probe insert (not shown) by reducing the area occupied by the two components, thereby reducing the lead length between the CS variable external capacitor 84 and the insert. Prior art structures require a compromise between having a good lead length between the fixed capacitor and variable capacitor and obtaining a good lead length between the variable capacitor and the insert. The present CS variable external capacitor 84 advantageously produces good lead lengths for both, which increases the Q and improves the performance of the NMR circuit. In addition, the number of parts in the probe is reduced by integrating the fixed capacitor 82 and the variable external capacitor 10 in the CS variable external capacitor 84 and assembly errors are decreased due to reduced assembly required in the probe.

It is understood that other fixed capacitors may also be used. In addition, an inner variable capacitor (not shown) may be inserted into the cavity 12 using the capacitor stick 80 in place of the fixed chip capacitors 82 to increase the range of the CS variable external capacitor 84. Such an inner variable capacitor may be configured similar to the CS variable external capacitor 84 shown and connected to a variable capacitor stick (not shown). The variable capacitor stick would be rotatable to adjust the capacitance of the outer CS variable external capacitor 84 and includes an inner adjustment stick rotatable to adjust the capacitance of the inner CS variable external capacitor 84. In addition, a stick with no fixed capacitors but just the current-conducting upper portion 96 will create a short that may sometimes be desirable. The retractable configuration allows the flexibility to change the capacitor stick to create a CS variable external capacitor 84 with a broad range of capacitances.

Figure 5:
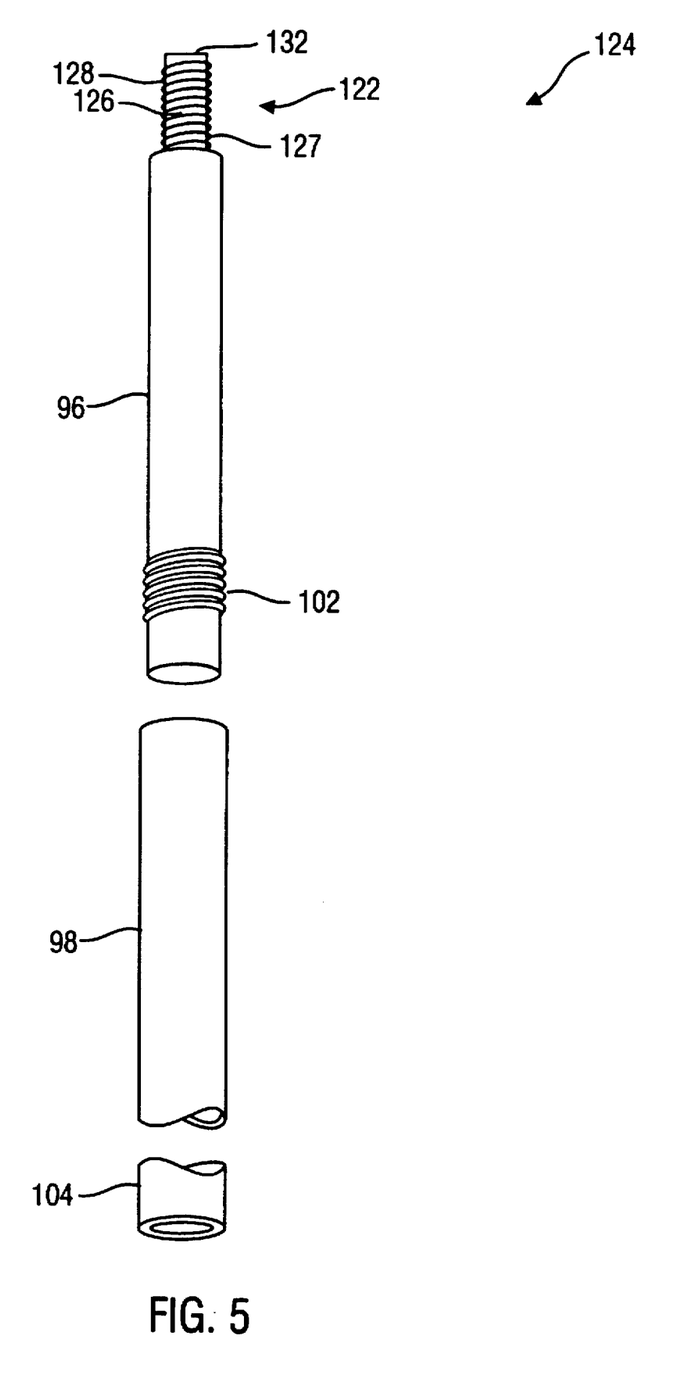
FIG. 5 is a perspective view of an inductor stick.

C. LC Variable External Capacitor In FIGS. 5 and 6, an LC variable external capacitor 118 has the same structure as the CS variable external capacitor 84 of FIG. 4 except that the fixed chip capacitors 82 of the capacitor stick 80 are replaced with a fixed inductor 122 on an inductor stick 124. The inductor stick 124 as illustrated in FIG. 5 is similar to the capacitor stick 80 but the top portion of the inductor stick 124 comprises a ceramic such as an alumina former 126 with an inductor 128 wrapped around it. The alumina former 126 desirably has a current-conducting section 127, such as a copper threaded section, that allows the alumina former to make electrical contact with the drum 18 and rail 22 through the plunger 20 and inductor stick 124 facilitated by the threaded adapter 90 as in the case of the capacitor stick 80. The top of the inductor 128 advantageously includes a currentconducting metal cap 132 to make electrical contact with the silver deposit plate 34 of the variable external capacitor 10.

Figure 6:
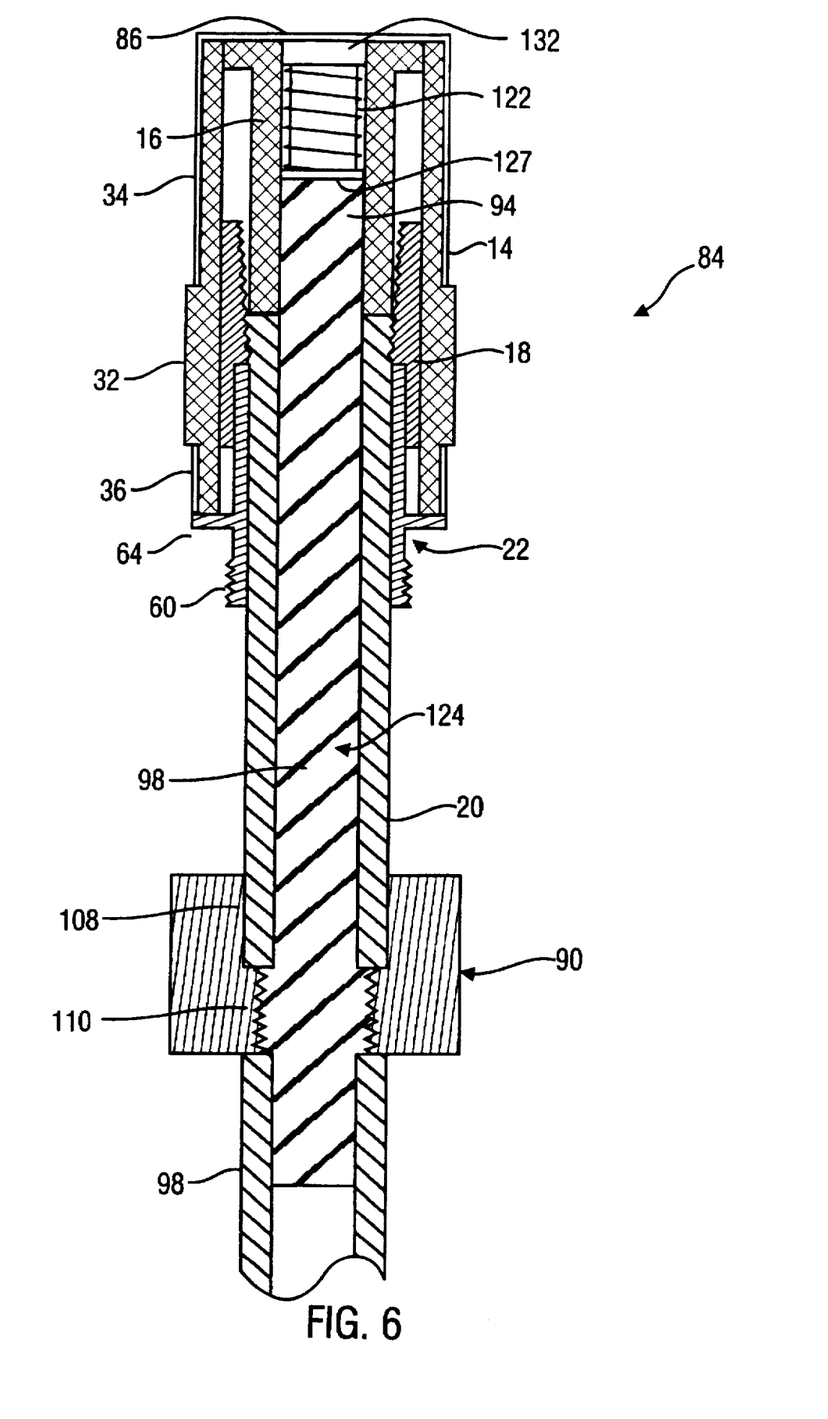
FIG. 6 is a cross-sectional view of the LC variable external capacitor.
Figure 7:
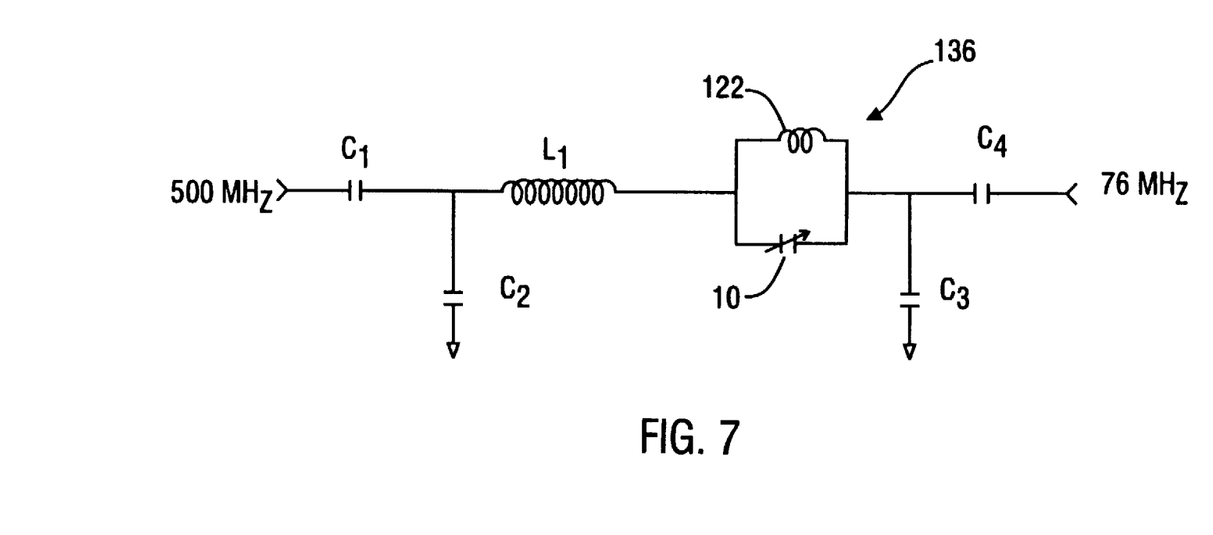
FIG. 7 is a circuit illustrating the isolation of frequencies in an LC variable external capacitor.

As assembled in FIG. 6, the insertion of the inductor stick 124 into the variable external capacitor 10 creates a parallel LC resonant circuit 136. The parallel LC resonant circuit 136 in the LC variable external capacitor 118 advantageously functions as a filter to eliminate certain frequencies from reaching certain regions of the NMR circuit. The elimination of undesirable frequencies from reaching certain areas is important, for instance, in a double tuned circuit, in which a single coil resonates at two different frequencies, (e.g., 500 MHz and 76 MHz). Such a double tuned circuit would generally be a two port circuit. To prevent the 500 MHz frequency from exiting the 76 MHz port, it would be necessary to trap the 500 MHz frequency and vice versa. A parallel resonant circuit can be used as such a trap to trap one of the frequencies by creating an infinite impedance at the trap frequency. A circuit segment is illustrated in FIG. 7 to include the parallel resonant circuit created in the LC variable external capacitor 118. When the parallel resonant circuit is tuned to 500 MHz, it would be a trap that prevents the 500 MHz from passing through.

The inductor stick 124 creates a tunable resonant structure in the LC variable external capacitor 118. Although tunable resonant structures are available, prior structures do not provide the flexibility of changing the inductor 122 (by changing the inductor stick 124) or completely removing the inductor 122 (to form the variable external capacitor 10). In another embodiment, a quarter wave inductor using a 0.141" coax may be used for the inductor stick (not shown). In such an embodiment, a cap is provided to contact the upper capacitor member 34 of the variable external capacitor 10 and a threaded portion is provided on the outside can of the coax to allow the coax to be screwed onto the lower capacitor member 18.

It will be understood that the above-described arrangements of apparatus and the methods therefrom are merely illustrative of applications of the principles of this invention and many other embodiments and modifications may be made without departing from the spirit and scope of the invention as defined in the claims.

What is claimed is:

1. A variable external capacitor in a nuclear magnetic resonance probe comprising:
    a housing including an external capacitor member and a current-conducting ring insulated from said external capacitor member, said housing defining a capacitor cavity;
    an internal capacitor member disposed at least partially inside said capacitor cavity and spaced from said external capacitor member by a distance, said internal capacitor member movable within said capacitor cavity to vary said distance, said internal capacitor member insulated from said external capacitor member;
    a current-conducting rail connected between said ring and said internal capacitor member; and
    a current-conducting plunger connected to said internal capacitor member and said rail, said plunger adjustable to move said internal capacitor member in said capacitor cavity.

2. The variable external capacitor of claim 1, wherein said housing is a hollow polytetrafluoroethylene cylinder having silver deposited over one end of said hollow polytetrafluoroethylene cylinder to form said external capacitor member and silver deposited around another end of said hollow polytetrafluoroethylene cylinder to form said current-conducting ring.

3. The variable external capacitor of claim 1, wherein said internal capacitor member is a hollow cylinder and has an outer surface that is slidably connected to an interior wall of said housing.

4. The variable external capacitor of claim 3, wherein said current-conducting plunger is a hollow cylinder and has an outer threaded portion threadably connected with an inner threaded portion of said internal capacitor member.

5. The variable external capacitor of claim 4, wherein said current-conducting rail rotatably locks said internal capacitor member to said ring.

6. The variable external capacitor of claim 5, wherein said rail comprises at least one groove and said internal capacitor member includes at least one tab which cooperates with said at least one groove to prevent rotation between said rail and said internal capacitor member, said rail having a flange portion soldered onto said ring.

7. The variable external capacitor of claim 1, wherein said rail comprises a threaded portion which mounts said variable external capacitor onto a board.

8. The variable external capacitor of claim 1, wherein said plunger is spaced from said external capacitor member by a fixed distance.

9. The variable external capacitor of claim 1, further comprising a current-conducting adjustment stick connected to said plunger and including a reactance connected between said external capacitor member and said plunger.

10. The variable external capacitor of claim 9, wherein said reactance comprises a plurality of fixed capacitors connected to each other and insulated from said internal capacitor member, one of said plurality of fixed capacitors connected with said external capacitor member and another of said plurality of fixed capacitors connected with said plunger.

11. The variable external capacitor of claim 10, wherein said plurality of fixed capacitors comprise at least two chip capacitors soldered in series.

12. The variable external capacitor of claim 10, wherein said plurality of fixed capacitors have a fixed capacitor breakdown voltage that is approximately the same as a variable capacitor breakdown voltage of a variable capacitor formed between said external capacitor member and said internal capacitor member.

13. The variable external capacitor of claim 1, further comprising a non-conducting adjustment stick passing through said capacitor cavity and a hole provided in said external capacitor member.

14. A variable external capacitor comprising:
    a variable capacitor having a stationary capacitor component, a movable capacitor component movable relative to said stationary capacitor component, and a dielectric disposed between said stationary capacitor component and said movable capacitor component, said dielectric and said stationary capacitor member defining an internal cavity;
    a reactance disposed at least partially within said internal cavity and connected between said stationary capacitor component and said movable capacity component; and
    a retractable rod connected to said reactance and said movable capacitor component, said rod adjustable to move said movable capacitor component relative to said stationary capacitor component and to retrieve said reactance from said internal cavity.

15. The variable external capacitor of claim 14, wherein said variable capacitor comprises a dielectric hollow housing with said stationary capacitor component connected near one end and said movable capacitor component disposed near another end of said dielectric hollow housing.

16. The variable external capacitor of claim 14, wherein said reactance comprises a plurality of chip capacitors connected in series.

17. The variable external capacitor of claim 14, wherein said reactance comprises an inner variable capacitor.

18. The variable external capacitor of claim 17, wherein said rod has a cavity through which an inner adjustment rod is disposed and adjustably connected to said inner variable capacitor.

19. The variable external capacitor of claim 14, wherein said rod is rotatable and non-translatable, said movable capacitor component is non-rotatable and translatable, and said rod is threadably connected to said movable capacitor component to convert a rotational adjustment of said rod into a translational displacement of said movable capacitor component.

20. An adjustable external capacitor comprising:

a variable capacitor having a cavity;

a reactance releasably disposed within said cavity and electrically connected across said variable capacitor; and a means for adjusting the capacitance of said variable capacitor.

21. The adjustable external capacitor of claim 20, wherein said reactance comprises a fixed capacitor.

22. The adjustable external capacitor of claim 20, wherein said reactance comprises an inner variable external capacitor having a second cavity.

23. The adjustable external capacitor of claim 22, further comprising a second reactance disposed within said second cavity and electrically connected across said inner variable capacitor.

24. The adjustable external capacitor of claim 20, wherein said variable capacitor comprises a first capacitor plate and a second capacitor plate separated by a dielectric and movable relative to each other, said first capacitor plate and said dielectric defining said cavity therebetween.

25. The adjustable external capacitor of claim 24, wherein said means comprises a rotatable plunger spaced from said first capacitor plate and extending outside said cavity, said rotatable plunger rotatably connected to said second capacitor plate to adjust a spacing between said first capacitor plate and said second capacitor plate.

26. The adjustable external capacitor of claim 25, wherein said rotatable plunger is separated from said first capacitor plate by a fixed distance and said second capacitor plate is nonrotatable, said rotatable plunger connected to said second capacitor plate by a screw mechanism to convert a rotational adjustment of said rotatable plunger to a translational movement of said second capacitor plate.

27. The adjustable external capacitor of claim 26, wherein said means further comprises a rail attached to said dielectric of said variable capacitor, said rail supporting said plunger for rotation and preventing said plunger from translational movement.

28. The adjustable external capacitor of claim 27, wherein said rail has at least one groove and said second capacitor plate has at least one tab, said at least one tab engaging with said at least one groove to preclude rotational therebetween.

29. The adjustable external capacitor of claim 27, wherein said rail has a smooth rail surface and said second capacitor plate has a smooth plate surface slidably connected to said smooth rail surface for current transmission.

30. The adjustable external capacitor of claim 27, wherein said rail includes a threaded portion which cooperates with a threaded nut for mounting onto a board.

* * * * *